Oct. 23, 1956 E. P. THIAS 2,768,300

FINE TUNER FOR TURRET TYPE TUNERS

Filed April 9, 1952

INVENTOR.
EDWIN P. THIAS

BY Ostrolenk & Faber

ATTORNEYS 2,768,300
Patented Oct. 23, 1956

2,768,300

FINE TUNER FOR TURRET TYPE TUNERS

Edwin P. Thias, Hollywood, Calif., assignor to Standard Coil Products Co., Inc., Los Angeles, Calif., a corporation of Illinois Application April 9, 1952, Serial No. 281,386

6 Claims. (Cl. 250—40)

My present invention is a continuation-in-part of my application No. 129,956, filed November 29, 1949, Patent No. 2,620,378, issued December 2, 1952 and relates to variable capacitances, and more particularly to an improved fine tuner capacitance which may be utilized in conjunction with a television frequency input tuner of the turret type shown in the Thias and White U. S. Patent No. 2,496,183, dated January 31, 1950.

Turret type input tuners have found wide acceptance in the manufacture of television receivers. The tuner generally comprises a rotatably mounted drum having a plurality of panels, each of which is adapted to receive a frequency band corresponding to a particular television station channel.

The desired channel may be selected by rotating the drum by means of an attached shaft and knob.

In order to be able to tune in the channel exactly after selection, a fine tuning adjustment is usually provided which varies the impedance value of the circuit selected.

After a television station is tuned in perfectly, it is preferred that no further tuning adjustment be required in order to prevent annoying interruptions to the viewer.

Therefore, it is particularly important that the fine tuner capacitor of the input tuner maintain a constant capacitance after initial adjustment. At the present and contemplated television frequencies a slight deviation in the spacing of the dielectric member, or in the electrodes of the capacitor, causes a large variation of impedance and consequent detuning. It is therefore an important matter to keep the relationships of the components fixed for any setting of the capacitor.

In the above application, the fine tuner capacitor plates consist of a conductive plate mounted on an insulator plate which is, in turn, secured over an aperture in the tuner chassis, and a ground plate in parallel spaced relation to the conductive plate attached to the chassis.

In mounting the conductive plate, a great deal of difficulty was encountered in properly insulating the plate from the chassis, not because the insulating was difficult but because the particular material used for insulation did not necessarily have the same coefficient of expansion as the chassis wall on which it was mounted.

Various methods were utilized in an attempt either to obtain adequate and consistant temperature compensation or to reduce the result of difference in expansion or movement of the insulating plate and the chassis wall, so that the difference in the coefficient of expansion of each of the units would not matter.

This problem exists whether the insulator plate is mounted on either the inside or the outside of the chassis wall.

The solution to the problem is the utilization of an insulating button made of a ceramic of virtually no coefficient of expansion having a fire contact conductive surface deposited thereon, the surface acting as one plate of the fine tuning condenser and so integrated with the chassis wall which carries the other electrode of the capacitor that any variation of the position of the chassis wall and the electrode secured thereto will result in an identical variation of the position of the ceramic member.

An object, therefore, of the present invention is to provide for a fine tuning capacitor for a television input tuner, the capacitance of which will, at any particular setting, remain constant irrespective of any temperature variation.

Another object of the invention is the arrangement of a fine tuner capacitance of a television input tuner so that the electrodes, which are mounted on the chassis of the television input tuner, will individually be independent of any thermal effects which may occur that will affect the chassis wall so that variations in the position of the electrodes carried by the chassis wall will be simultaneous and identical thereby maintaining the desired electrode spacing at all times.

Another object of the present invention is the provision of a fine tuner capacitor for a television input tuner wherein the elements of the fine tuner assembly are simplified in construction, are readily adapted to the television input tuner structure with which they are to cooperate, may be readily mounted in place and may be made, assembled and mounted by mass production procedures.

Thus, my invention contemplates in one specific embodiment a ceramic button having virtually no coefficient of expansion (such as steatite) mounted in an aperture of a chassis wall of a turret type television input tuner; a conductive surface is deposited on the ceramic button and forms one electrode of the fine tuner. A conductive plate, functioned as a second electrode of the same material as the chassis wall is secured to the said chassis wall so that a portion thereof will extend in spaced parallel relation, to the conductive surface of the button. A rotatable dielectric plate, suitably supported, is inserted between the two plates of the capacitor, to vary the dielectric property of the medium therebetween and thus vary the capacitance.

An advantage of the invention is that no special compensation mounting is required.

Other objects, features and advantages will appear in the subsequent detailed description, wherein.

Figures 1, 2:
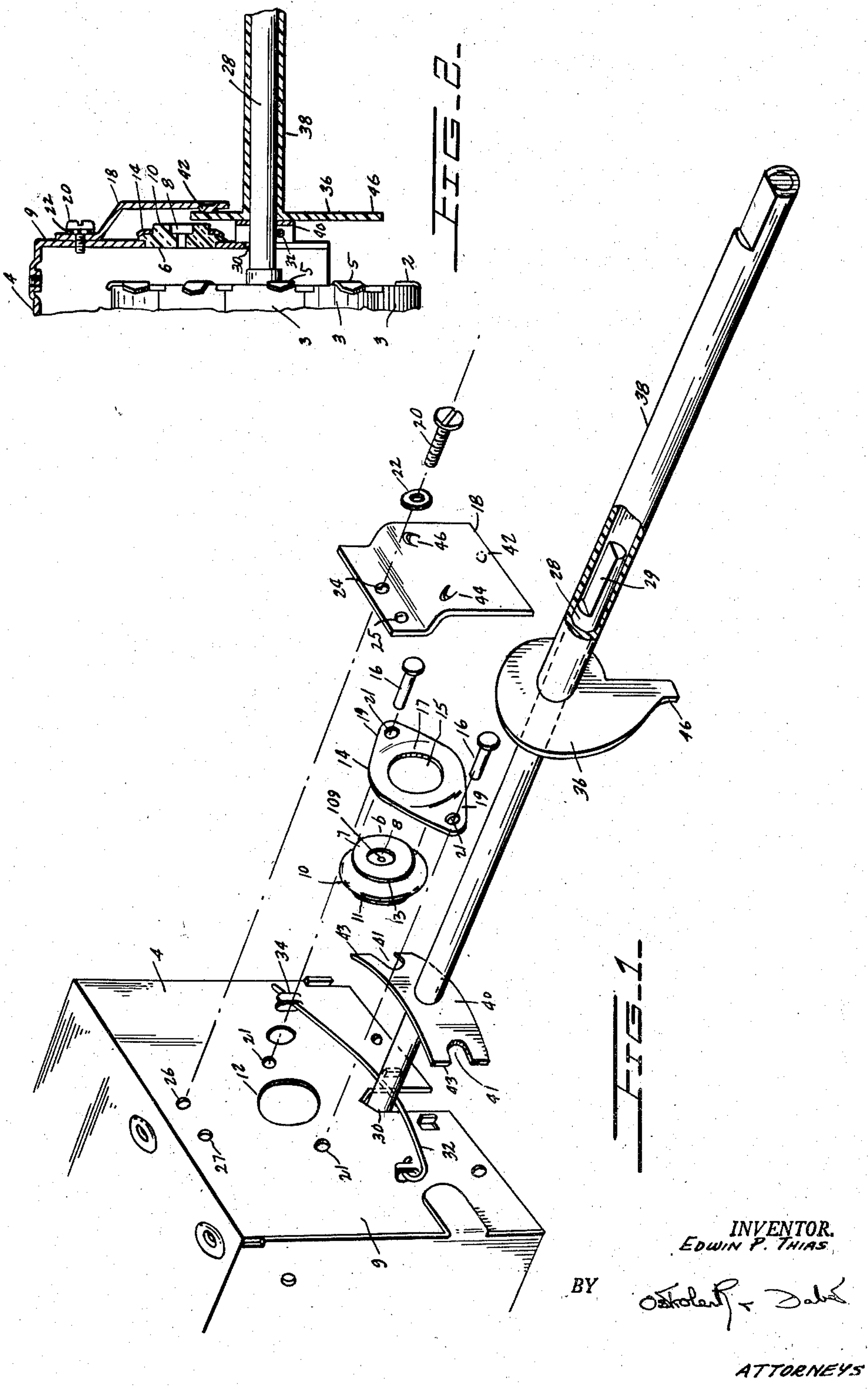
Figure 1 is an exploded view of one end of a turret type television input tuner embodying the invention.
Figure 2 is a side sectional elevation partly in nonsection of the embodiment illustrated in Figure 1.

Referring to Figures 1 and 2, I have shown an operative end of a television input tuner of the type shown and described in my application Serial No. 129,956, and the Thias and White U. S. Patent No. 2,496,183 mentioned above.

Essentially, the television input tuner in chassis 4, as there described, is arranged so that rotation of shaft 28 by a knob (not shown) secured to the outer end of shaft 28 and maintained angularly locked with respect to shaft 28 by the flat indentation 29, will serve to rotate the channel selector turret 2 which, in turn, is rotatably carried in chassis 4.

The turret 2 comprises a plurality of removable panels 3 and is held in position by suitable means such as spring clips 5 and other means, described in the above application and patent. Each panel or associated pair of panels carries a coil or coils adapted, when connected into a television circuit, to adjust the set to receive a particular channel.

Stationary contact members (not shown here but shown in the above mentioned patent and application) engage contact elements on the panels so that at each angular position of the turret, one panel or one pair of panels will be in circuit while the other panels are disconnected.

Although the coils carried by each panel are adjusted for optimum response for the particular channel for which the panel is to act as a selector, unanticipated variations in conditions of use, distance from transmitters, idiosyncrasies of particular locations, and, at times, a slight change in the condition of the coils carried by the panels, make necessary the utilization of a fine tuner which may be manually operated to adjust the television set for these variations.

While such fine tuners have been used, ambient temperature conditions owing to unpredictable variations in the operating temperature, and the particular geographical or room location, have previously effected the fine tuner setting. That is, fine tuning adjustment when made, may vary later on in the operation of the set owing to variation of ambient temperature and therefore, require resetting of the fine tuner.

In carrying out my invention, a steatite button 6 having virtually no coefficient of expansion is mounted on the front wall 9 of chassis 4. The steatite button 6 has an extension 11 passing into and fitting in aperture 12 of wall 9 and a flange or collar 10 which rests against the portion of wall 9 surrounding the aperture 12. The button 6 has a forward section 13 on the outer flat surface of which the electrically conductive surface 7 may be deposited in any suitable manner. Preferably, a silver electrode is deposited by any of the processes now known for forming a fine or homogeneous electrically conductive surface on a ceramic member.

Collar 14 has an opening 15 which passes over the extension 13 of button 6. Collar 14 is also provided with an indented recess 17 which fits over and is reciprocally positioned by the collar 10 of button 6. Collar 14 also has lateral extensions 19 which may engage wall 9 of chassis 4 in surface to surface relation therewith and may be riveted thereto by rivets 16 passing through openings 21 of wall 9 of chassis 4.

The collar 14 thereby maintains button 6 firmly in position at the front of wall 9 of chassis 4; by this means, therefore, any shift whatever of wall 9 of chassis 4, owing to any condition, thermal or otherwise, will result in an exactly corresponding shift of electrically conductive surface 7 forming one of the electrodes of the fine tuner.

This is of the utmost importance and of the essence of the present invention since, as hereinafter described, the other electrode 18 of the fine tuning condenser is made of the same material as wall 9 of chassis 4 and is carried by wall 9 of chassis 4.

Thus, any shift of wall 9 of chassis 4, owing to any condition, thermal or otherwise, will result in identical shifting of electrode 7 and electrode 18 of the fine tuning capacitor, thereby always maintaining the exact predetermined spacing between them, irrespective of variations in ambient conditions.

The disc shaped indentation 8 is provided in button 6 to allow a wire, not shown, to be inserted through the aperture 109 of the button 6 and soldered in the said indentation 8. As more particularly described in the above application and patent, this wire is connected to the larger fixed capacitors which are utilized in conjunction with the coil or coils on the panels 3 to tune a specific band of frequencies corresponding to a television channel. Thus, the fine tuning capacitor is used to tune in more accurately the channel selected by the rotation of the turret 2 as above explained.

Ground plate 18, the other electrode of the above tuning capacitor, is attached to the chassis 4 by means of the screw 20 which passes through the aperture 24 and is engaged in the threaded aperture 26. Washer 22 journaled on the screw 20 maintains the screw 20 in tightened position. The projection 25 on the ground plate 18 fits into the aperture 27 on the chassis wall 9 in such manner that the rotation of the ground plate 18 about the screw 20 will be prevented when screw 20 is in tightened condition. The ground plate 18 is bent to allow a portion thereof to be mounted in surface to surface engagement with the wall 9. The ground plate 18 will thereby have a portion extending in spaced parallel relation to the conductive surface 7 of the ceramic button 6 mounted on the chassis wall 9, thus defining the two plates of the tuning capacitor. The ground plate 18 material will preferably be the same as the material utilized in the wall 9, or a material having substantially the same coefficient of expansion. Thus, any change in the physical dimensions of the chassis wall 9 will be substantially duplicated by identical changes in the ground plate 18.

Since the ceramic button 6 and hence, the conductive surface 7 thereof, is rigidly mounted on the chassis wall 9, and since the ceramic material has a low or virtually no coefficient of expansion, the capacitance between the two electrodes will remain constant irrespective of temperature variation.

The shaft 28 which rotatably operates the turret 2 is positioned in the slot 30 and is retained in position by the wire spring 32 fixed in tensioned position by the bent fingers 34.

A dielectric plate 36 is secured to a hollow shaft 38 perpendicular to the axis thereof. The hollow shaft 38 is journaled over the shaft 28 in such a manner that the dielectric plate 36 extends laterally between the ground plate 18 and the conductive surface 7. As can be seen in Figure 1, the dielectric plate 36 assumes the shape of a spiral, whereby, upon rotation thereof, between the capacitor above defined, varying amounts of dielectric plate 36 intrude between the two plates 7 and 18 of the capacitor in a straight lined function relative to the rotation. Thus, the capacitance of the fine tuning capacitor is varied in a linear manner.

The leaf spring 40 which is journaled on the shaft 28 is maintained in a tensioned position against the chassis wall 9, the recesses 41 of the spring 40 providing the space for the spring 32 so that the edges 43 of the spring 40 are in close contact with the chassis wall 9. The spring 40 is chosen to have an arcuate shape such that the dielectric plate 36 is maintained in a resilient contact with the dimple 42 on the ground plate 18. This biasing effect maintains the position of the dielectric plate 36 to prevent rotation thereof, after initial adjustment, and to stop the rotation of the dielectric plate 36 at maximum capacity values of the fine tuner capacitor.

Thus, the tuning capacitor is changed from a minimum to a maximum capacitance by nearly 360 degree rotation of the shaft 38 while additional rotation in one direction which would only serve to duplicate the tuning cycle is prevented.

My invention, therefore, provides a fine tuner capacitance which will remain substantially constant, irrespective of any temperature variation. This is because one of the electrodes is mounted on an insulating button of a material having substantially no coefficient of expansion, the button being carried by and virtually integrated with a wall of the chassis of the television input tuner; the other electrode of the capacitance being of the same material as the wall and being carried thereby. In this way, any thermal effects which may occur will affect the chassis wall and the second electrode in the same way so that variations in the position of the electrode carried by the button in the chassis wall and the second electrode, which is secured to the same chassis wall, will be simultaneous and identical, thereby maintaining the desired electrode spacing at all times.

The invention also provides for a fine tuning capacitor for a television input tuner wherein the elements of the fine tuner assembly are simplified in construction, and are readily adapted to the television input tuner structure with which they are to operate. As can be seen from the above, the fine tuner elements may be readily mounted in place and may be made, assembled and mounted by mass production procedures.

In the foregoing, I have described my invention solely in connection with specific illustrative embodiments thereof. Since many variations and modifications of my invention will now be obvious to those skilled in the art, I prefer to be bound not by the specific disclosures herein contained but only by the appended claims.

I claim:

1. A television input tuner including a chassis, a rotatable channel tuning device carried by said chassis, a tuning shaft extending through a wall of the chassis and operatively connected to said rotatable device, and a fine tuning capacitor having capacitance substantially independent of temperature variation comprising an insulation member of substantially no coefficient of expansion with a conductive layer on one side thereof, fastening means rigidly securing said insulation member in an aperture of and to said chassis wall, said insulation member being arranged to hold said conductive layer fixed with respect to said wall, a conductive plate secured to said wall with a portion extending in spaced relation to said conductive layer and defining two plates of said capacitor, the capacitance of which thereby remains substantially constant with temperature variation, and a dielectric member variably movable between said two spaced capacitor plates.

2. A television tuner as defined in claim 1, further including a hollow shaft rotatably mounted upon the tuning shaft and secured with the dielectric member to effect fine tuning control.

3. A television tuner as defined in claim 1, in which the conductive layer is held spaced from the chassis wall external of the tuner chassis, and in which the conductive plate is bent away from the chassis wall and further bent to effect the extension of the plate portion with respect to the conductive layer.

4. A television tuner as defined in claim 1, in which the fastening means includes a collar with a cavity encompassing the insulation member against the chassis wall.

5. A television tuner as defined in claim 4, in which the insulation member is of disc shape and the collar cavity of corresponding annular shape.

6. A television tuner as defined in claim 1, in which the rotatable tuning device is of turret construction with tuning panels arranged for consecutive broadcast channel reception, and the fine tuning capacitor is effective for each of the channel reception modes of tuner operation.

References Cited in the file of this patent

UNITED STATES PATENTS

| | | |
|---|---|---|
| 1,617,995 | Ellis | Feb. 15, 1927 |
| 2,079,894 | Bechmann | May 11, 1937 |
| 2,134,794 | Muth | Nov. 1, 1938 |
| 2,488,791 | Zaat | Nov. 22, 1949 |
| 2,488,901 | Del Camp | Nov. 22, 1949 |
| 2,584,120 | Fyler | Feb. 5, 1952 |
| 2,598,247 | Frihart | May 27, 1952 |
| 2,620,378 | Thias | Dec. 2, 1952 |